United States Patent
Lee et al.

(10) Patent No.: US 6,436,794 B1
(45) Date of Patent: Aug. 20, 2002

(54) PROCESS FLOW FOR ARS MOVER USING SELENIDATION WAFER BONDING BEFORE PROCESSING A MEDIA SIDE OF A ROTOR WAFER

(75) Inventors: Heon Lee, Sunnyvale; Chung-Ching Yang, Saratoga; Peter Hartwell, Sunnyvale, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/860,453

(22) Filed: May 21, 2001

(51) Int. Cl.[7] ............... H01L 21/30; H01L 21/46

(52) U.S. Cl. ............... 438/459; 438/455; 355/151

(58) Field of Search ............... 438/455, 459; 365/151

(56) References Cited

U.S. PATENT DOCUMENTS

| | | | |
|---|---|---|---|
| 5,557,596 A | 9/1996 | Gibson et al. | 369/101 |
| 5,661,316 A | 8/1997 | Kish, Jr. et al. | 257/190 |

Primary Examiner—John F. Niebling
Assistant Examiner—David A. Zarneke

(57) ABSTRACT

An improved process flow for an atomic resolution storage (ARS) system deposits conductive electrodes on a media side of a rotor wafer before wafer thinning process, i.e., grinding and CMP, thus protecting the conductive electrodes on a media surface from the grinding process. In addition, the CMOS circuitry is formed in a stator wafer at a relatively later stage. Therefore, the CMOS circuitry is less likely to be damaged by heat processing. In addition, some of the necessary processing may be performed with loosened thermal budget. Finally, because wafer bonding of the rotor wafer and the stator wafer is performed at a later stage, there is less probability of degradation of the wafer bonding. Accordingly, device yield may be enhanced, leading to lower manufacturing cost.

14 Claims, 16 Drawing Sheets

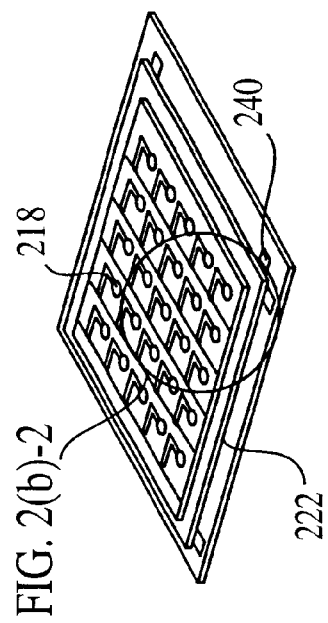
FIG. 2(b)-1
Figure 2(b)-1
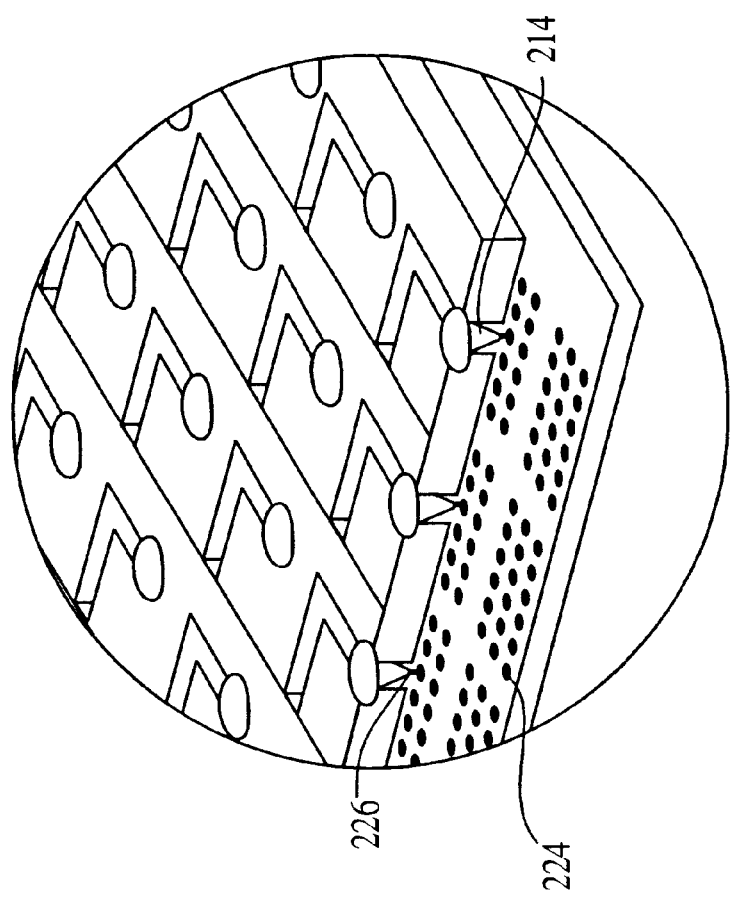
Figure 2(b)-2

US 6,436,794 B1

PROCESS FLOW FOR ARS MOVER USING SELENIDATION WAFER BONDING BEFORE PROCESSING A MEDIA SIDE OF A ROTOR WAFER

CROSS-REFERENCE TO RELATED PATENT APPLICATIONS

This patent application is related to U.S. Patent Application, entitled "Process Flow for ARS Mover Using Selenidation Wafer Bonding After Processing a Media Side of a Rotor Wafer," and filed on the same day herewith.

TECHNICAL FIELD

The technical field relates to an atomic resolution storage (ARS) system, and, in particular, to process flow for the ARS system using selenidation wafer bonding.

BACKGROUND

An ARS system provides a thumbnail-size device with storage densities greater than one terabit (1,000 gigabits) per square inch. The ARS technology builds on advances in atomic probe microscopy, in which a probe field emitter tip as small as a single atom scans the surface of a material to produce images accurate within a few nanometers. Probe storage technology may employ an array of atom-size probe field emitter tips to read and write data to spots on storage media.

An ARS system typically includes three bonded silicon (Si) wafers, i.e., a tip wafer, also known as an emitter wafer, a rotor wafer, also known as a mover wafer, and a stator wafer. The wafers are bonded together using wafer bonding techniques, which are well known in the art.

For the ARS system to operate, the rotor wafer and the stator wafer need to be processed by depositing conductive electrodes for nanometer precise position controls. FIGS. 1(a)–1(f) show a prior art process flow for an ARS system 100.

Referring to FIG. 1(a), a stator side (bottom side) of the rotor wafer 120(shown upside down in FIG. 1(a)) is processed first by depositing conductive electrodes 134(a), such as titanium/titanium-nitride (Ti/TiN) electrodes, on the stator side of the rotor wafer 120. A polycrystalline silicon (Poly Si) layer 102 and an insulating layer 104(a), such as an insulating silicon oxide ($SiO_2$) layer, is also deposited on the stator side of the rotor wafer 120. The Poly Si 102 is a typical form of Si that is deposited on a wafer, and may be "doped" to make the Si more conductive. At this point, the rotor wafer 120 is approximately 600 microns in thickness.

Referring to FIG. 1(b), CMOS circuitry 132 is formed in the stator wafer 130, followed by processing a rotor side of the stator wafer 130 with a conductive layer of electrodes 134(b), such as conductive Ti/TiN electrodes, an insulating layer 104(b), such as an insulating $SiO_2$ layer, and a silicon nitride ($Si_3N_4$) layer 106. The $Si_3N_4$ 106 may be used as an alternative insulating (dielectric) layer.

FIG. 1(c) shows subsequent bonding of the rotor wafer 120 and the stator wafer 130. Because the tip wafer (not shown) and the stator wafer 130 are normally 500–600 microns, the rotor wafer 120 may need to be trenched to, for example, approximately 100 microns in thickness after the bonding. The rotor wafer 120 is typically grinded on the media side using a wafer grinding machine.

However, the intense processing and grinding of the rotor wafer 120 may cause damage, such as stress, dislocations, mechanical twins, stacking faults, and incorporations of impurities on the wafer surface. Grinding is typically followed by a process referred to as chemical mechanical polishing (CMP), which removes another 1 micron to 5 microns of the Si wafer in a more "gentle" process that leaves the wafer surface with less damage.

FIG. 1(d) shows metallization of the media side of the rotor wafer 120 by depositing conductive electrodes 134(c), such as conductive Ti/TiN electrodes, for routing electrical signals and driving the rotor wafer 120. An insulating layer 104(c), such as an insulating $SiO_2$ layer, maybe coated beneath or over the conductive electrodes 134(c) on the media side of the rotor wafer 120 for electrical insulation and surface protection.

Referring to FIG. 1(e), suspension springs are formed by deep Si etching. First, a masking layer 150, such as a photoresist (PR) film layer, may be deposited over the conductive electrodes 134(c) on the media side of the rotor wafer 120. A predetermined portion of the masking layer 150 has been etched so that the potion of the rotor wafer 120 corresponding to the etched portion of the masking layer 150 is exposed. Next, the exposed potion of the rotor wafer 120 is removed by deep Si etching using the masking layer 150 as a mask, forming the suspension springs.

FIG. 1(f) shows the final steps of ARS system 100 processing, etching the insulating $SiO_2$ layer 104(c) with the mask, removing the masking PR layer 150, and laser dicing, which is a technique to cut a wafer into individual rectangular devices, i.e., dices, with a computer guided laser.

Following the series steps of wafer processing, the surface 160 for ARS storage media, which includes the conductive electrodes 134(c), is formed and may conduct with electronics in the tip wafer for the read/write operations.

However, the above described process flow for ARS system 100 has the following drawbacks. First, the surface 160 for the ARS storage media may be easily damaged by the thinning process, i.e., the grinding and CMP.

In addition, the CMOS circuitry 132, which controls the overall system operation including data input and output, is very sensitive to heat. Because the CMOS circuitry 132 is formed in the stator wafer 130 before other structures are formed and processed, the prior art process flow has tight thermal budget problem, i.e., the wafers cannot be processed with high temperature.

Similarly, due to the subsequent processing of the media side of the rotor wafer 120 and other processing steps, there may be higher probability of degradation of wafer bonding between the rotor wafer 120 and the stator wafer 130.

Higher probability of damage to the CMOS circuitry 132 after formation due to thermal processing, combined with degradation of wafer boning due to subsequent processing, may lead to decreased yield, which represents a number of correctly functioning devices on a wafer at the completion of mover processing, and higher manufacturing cost.

SUMMARY

A method for processing an ARS system includes depositing a protective layer on a first side, such as a media side, of a first wafer, such as a rotor wafer. The method further includes bonding the rotor wafer with a handle wafer, thinning the rotor wafer at a stator side of the rotor wafer, processing a stator wafer, bonding the rotor wafer and the stator wafer, detaching the handle wafer, and processing the media side of the rotor wafer by depositing conductive electrodes on the media side of the rotor wafer.

An embodiment of the method for processing the ARS system further includes forming suspension springs by patterning the protective layer, selectively etching the protective layer, and selectively deep Si etching the rotor wafer using the protective layer as a mask.

Another embodiment of the method for processing the ARS system further includes forming complementary metal oxide semiconductor (CMOS) CMOS circuitry in the second wafer, removing the protective layer, and laser dicing.

The improved process flow for the ARS system deposits the conductive electrodes on the media side of the rotor wafer before wafer thinning process, i.e., grinding and CMP, thus protecting the conductive electrodes on the media surface from the grinding process. In addition, the CMOS circuitry is formed in the stator wafer at a relatively later stage. Therefore, the CMOS circuitry is less likely to be damaged by heat processing. In addition, some of the necessary processing may be performed with loosened thermal budget. Finally, because the wafer bonding of the rotor wafer and the stator wafer is performed at a later stage, there is less probability of degradation of the wafer bonding. Accordingly, device yield may be enhanced, leading to lower manufacturer cost.

DESCRIPTION OF THE DRAWINGS

The preferred embodiments of the process flow will be described in detail with reference to the following figures, in which like numerals refer to like elements, and wherein:

FIGS. 2(a), 2(b)–1 and 2(b)–2 illustrate an exemplary ARS system;

DETAILED DESCRIPTION

Figure 1A:
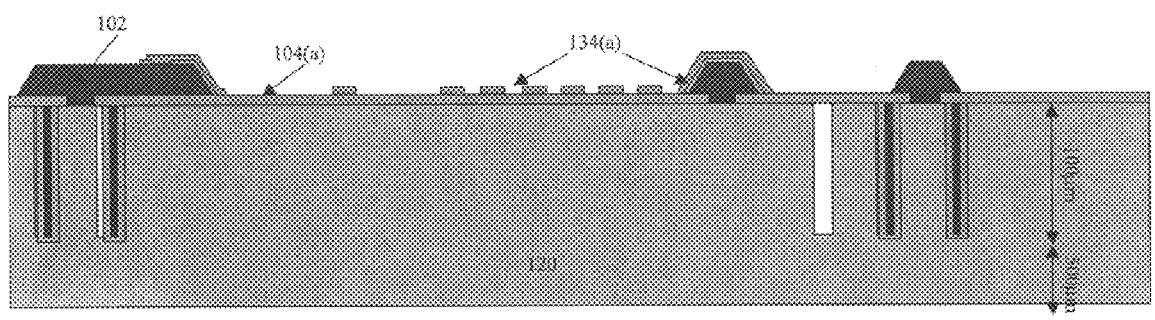
FIGS. 1(a)–1(f) show prior art process flow for an ARS system.
Figure 1B:
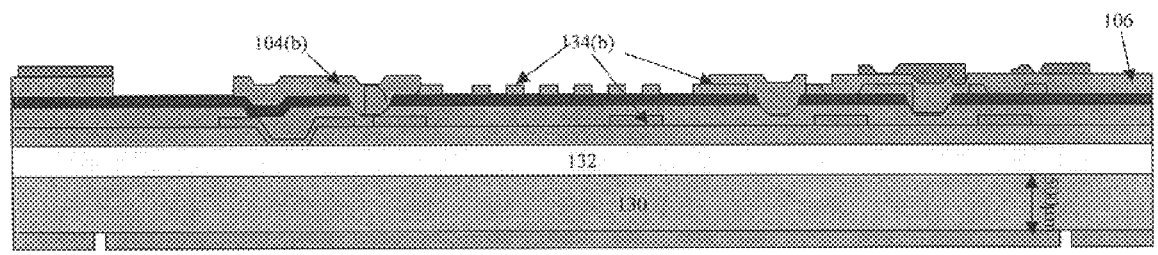
Figure 1C:
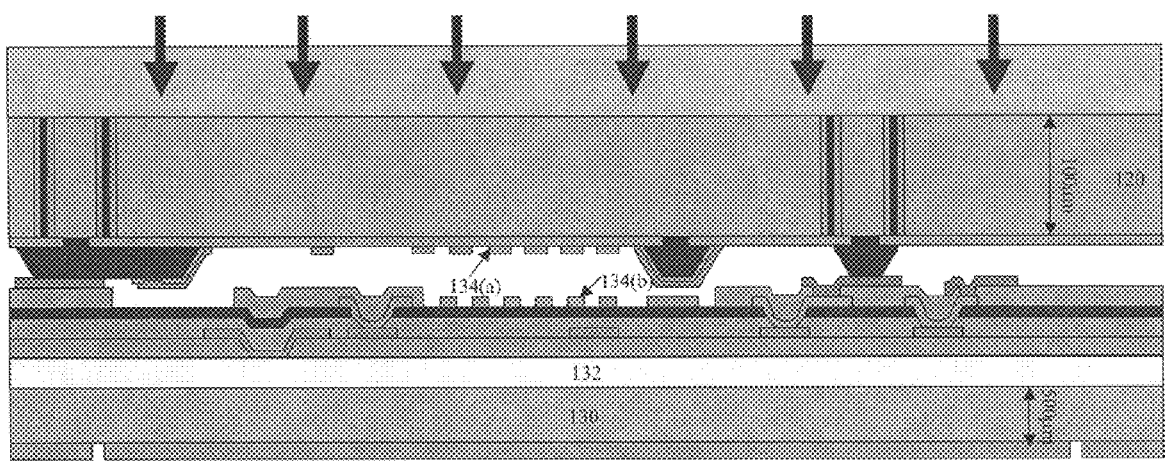
Figure 1D:
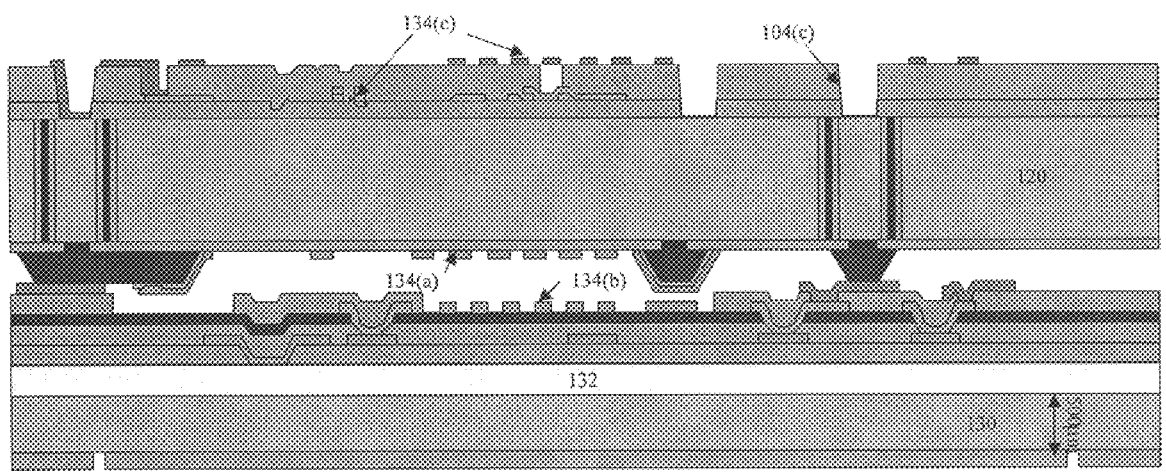
Figure 1E:
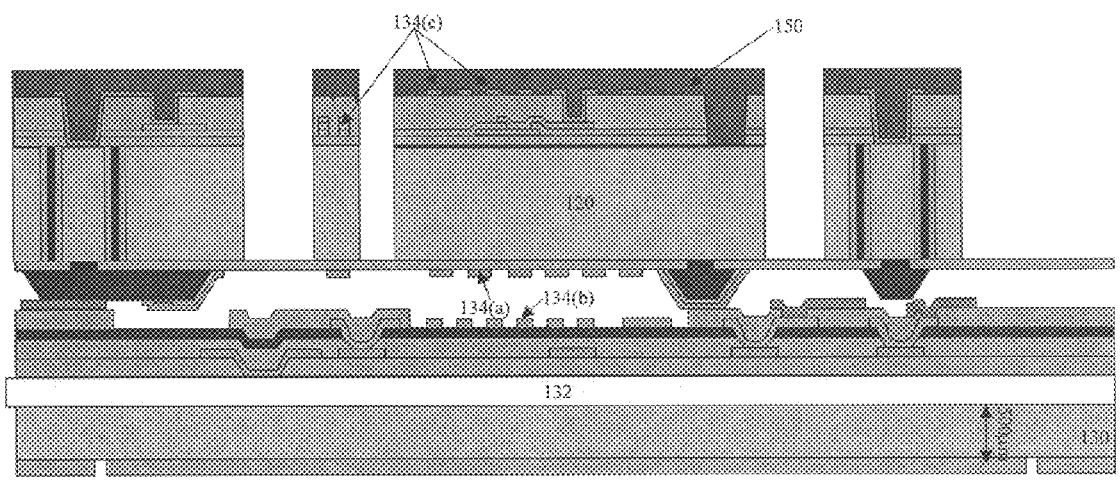
Figure 1F:
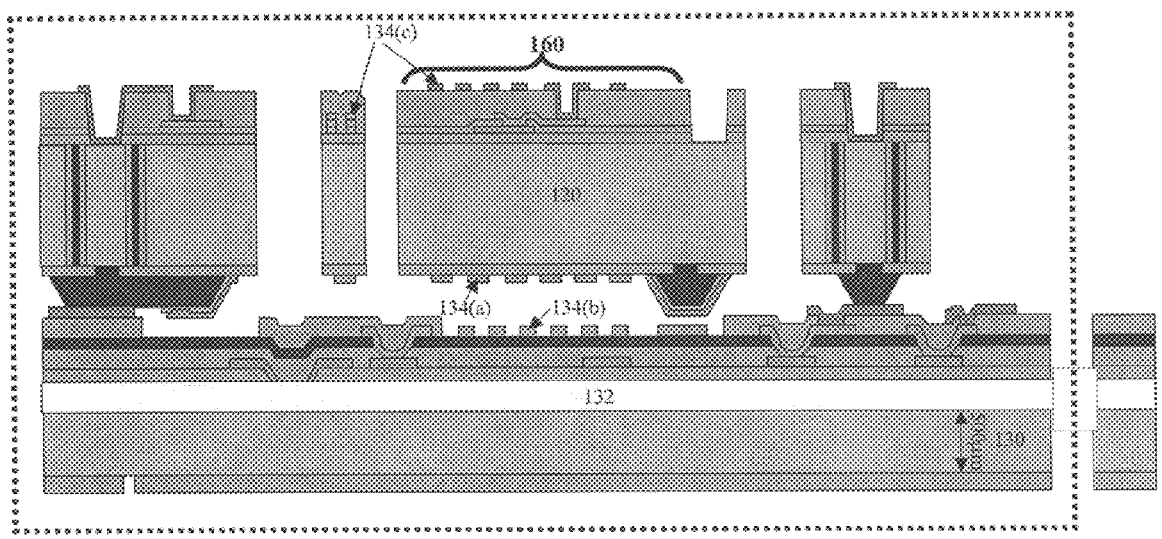
Figure 2A:
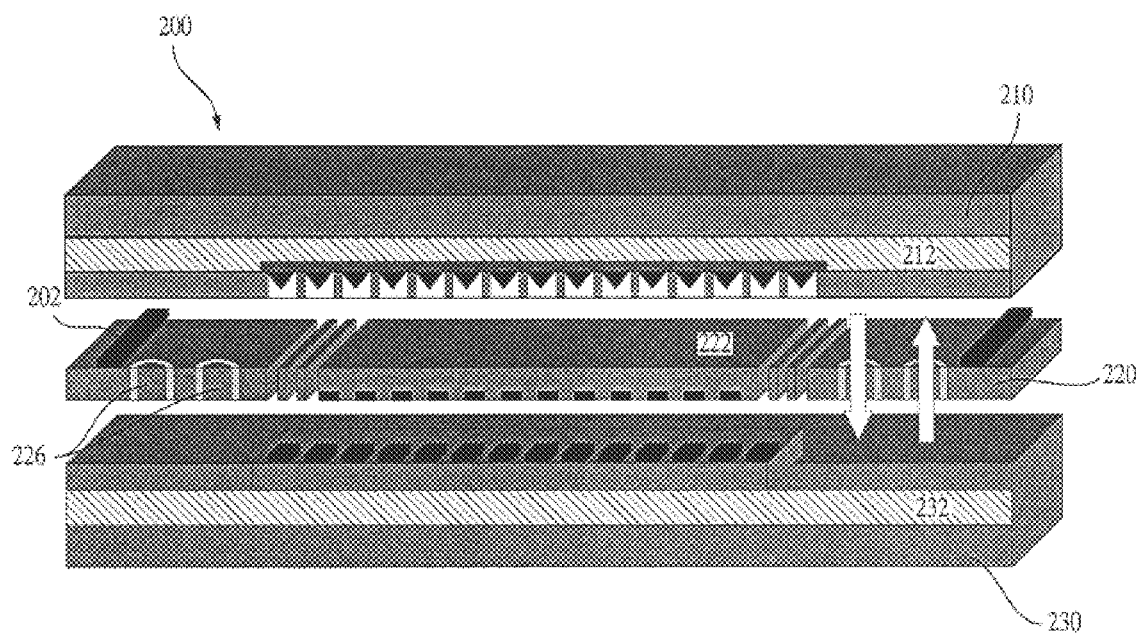

FIGS. 2(a) and 2(b) illustrate an exemplary ARS system 200. The ARS system 200 has high data storage capacity, up to 1000 Gb/in$^2$. The ARS system 200 is small, rugged, and portable. Additionally, the ARS system 200 has low power consumption, because there is typically no power consumption when the ARS system 200 is not being asked to perform an operation.

Referring to FIG. 2(a), the ARS system 200 includes three bonded Si wafers, i.e., a tip wafer 210, also referred to as a third wafer in this specification, a rotor wafer 220, also known as a mover wafer, and a stator wafer 230. The rotor wafer 220, typically 100 microns thick, is much thinner than the tip wafer 210 and the stator wafer 230. The wafers 210,220,230 are bonded together, as shown in FIG. 2(a), using wafer bonding techniques, which are well known in the art.

Each wafer-to-wafer bond requires internal cavity be sealed at high vacuum using ultra-high vacuum (UHV) seals 202, which helps to maintain the internal environment of the ARS chip. The wafer-to-wafer bond also requires low resistance electrical contacts. For example, as shown in FIG. 2(a), conductive electrodes on a stator side of the rotor wafer 220 may be coupled with conductive electrodes on a rotor side of the stator wafer 230. Conductive electrodes on a media side of the rotor wafer 220 may be connected to CMOS circuitry 232 located in the stator wafer 230. The tip electronics 212 control field emitter tips 214 (shown in FIG. 2(b)) that are required to interface with storage media 222 in the ARS system 200. The storage media 222, including medium recording cells 224 (shown in FIG. 2(b)), stores bits of data in the ARS system 200.

Read/write (R/W) electronics, which includes the CMOS circuitry 232, are also located in the stator wafer 230 beneath the conductive electrodes 234(b). The R/W electronics may control reading or writing of data bits in the storage media 222, and to access data bits in the storage media 222 to determine data bit value.

Through-wafer vias 226 enable electrical R/W signals (not shown) to pass from the CMOS circuitry 232 in the stator wafer 230 to the conductive electrodes on the media side of the rotor wafer 220, as well as the tip electronics 212 in the tip wafer 210.

FIG. 2(b) illustrates the operation of the ARS system 200. A single field emitter tip 214 creates an electron beam 216 by drawing electrons off a metal in the field emitter tip 214 with a high electric field. The electron beam 216 is focused and used to write data bits onto the storage media 212 by heating tiny data spots and altering the data spots' physical state or phase. The electron beam 216 may also be used to determine the data bit state (value) in the storage media 222. An emitter tip array 218 is an array of field emitter tips 214, under which the storage media 222 is moved with nanometer precision.

Suspension springs 240, shown in FIG. 2(b), may hold the rotor wafer 220 between the field emitter tips 214 and the stator wafer 230 to allow the data bits to be moved relative to the field emitter tips 214, thus allowing each field emitter tip 214 to access multiple data bits.

For the ARS system 200 to operate, the rotor wafer 220 and the stator wafer 230 need to be processed by depositing conductive electrodes for the nanometer precise position controls. This improved process flow for the ARS system 200 provides a novel way for depositing the conductive electrodes on the media side of the rotor wafer 220 and for bonding the rotor wafer 220 and the stator wafer 230. Conductors and other electronic devices used in the ARS system 200 are typically made of Si which need to be clean and smooth because dust may damage the electronic devices. The improved process flow may help to protect the surface for the ARS storage media from brutal wafer thinning process, so that electronic devices with high sensitivity to the ARS media surface may be used. Morever, because heat sensitive CMOS circuitry 232 is fabricated after some device processing, thermal budget for the some of the necessary device processing may be loosened. In addition, with wafer bonding performed at a relatively later stage, the improved process flow may lower the probability of wafer degradation between the rotor wafer 220 and stator wafer 230, leading to increased yield and lower manufacturer cost.

An embodiment of the improved process flow is illustrated in FIGS. 3–10. Referring to FIG. 3(a), a protective layer 350 may be coated over the media surface 460 of the rotor wafer 220 to protect the conductive layer of Ti/TiN electrodes 434(c) from subsequent processing. The protective layer 350 may be selectively removed from the media surface 460 after the processing without damaging the protected conductive electrodes 434(c). The protective layer 350 may also adhere to an In$_2$Se$_3$ bond layer (described later). A SiO$_2$ layer or a borophosphosilicate glass (BPSG) film, for example, may be used as the adhesive protective layer 350 for the rotor wafer 220.

Next, a novel wafer bonding technique may be utilized with a handle wafer 530. Since the rotor wafer 220 may become very fragile and difficult to handle during thinning and further processing, the handle wafer 530 maybe bonded with the rotor wafer 220 for easy handling. The handle wafer 530 may be mesh-shaped, reusable, and made of rigid material, such as alumina.

Figure 3A:
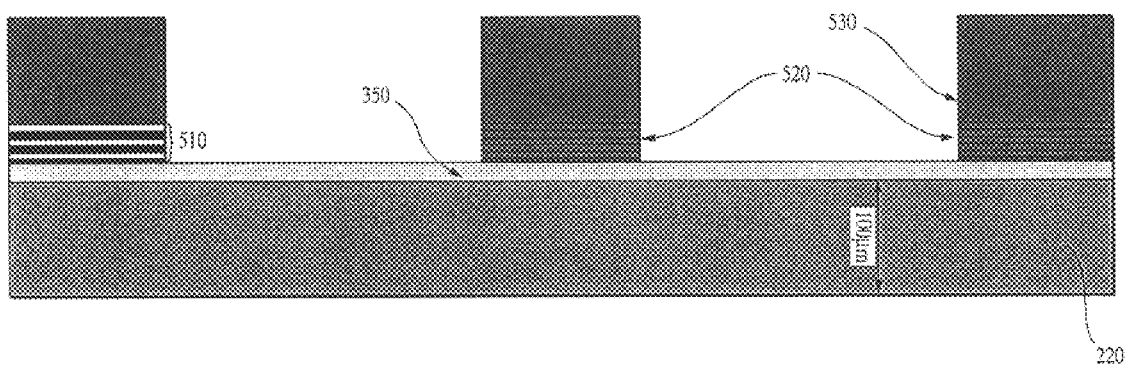
FIGS. 3(a), 3(b) aid
Figure 3B:
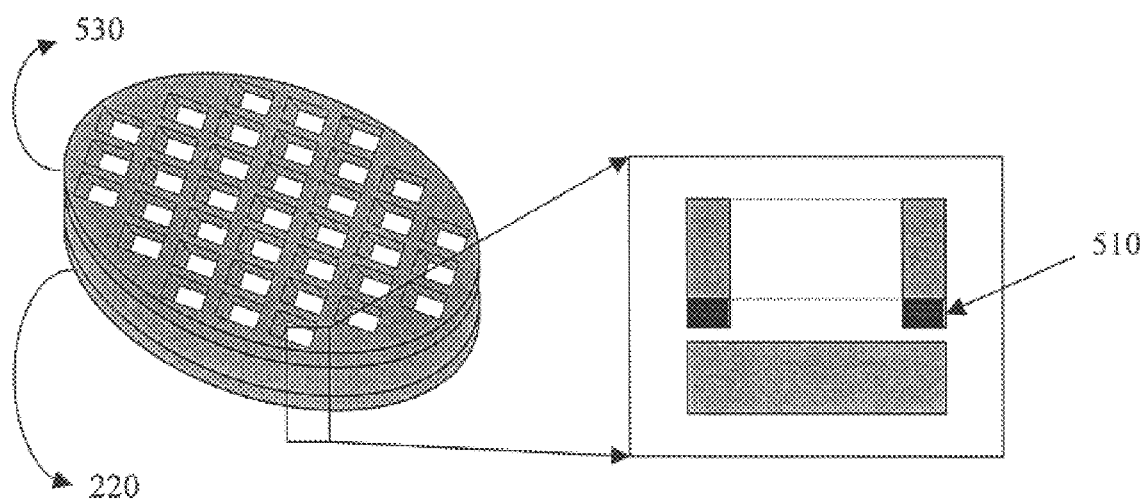

FIG. 3(b) illustrates how the handle wafer 530 is bonded with the media side of the rotor wafer 220 using, for example, selenidation reaction. The rotor wafer 220 may be bonded with the handle wafer 530 using any type of wafer bonding technique that is compatible with typical CMOS processing. Wafer bonding techniques are described, for example, in U.S. Pat. No. 5,661,316, to Kish, Jr. et al., entitled "Method For Bonding Compound Semiconductor Wafers To Create An Ohmic Interface," which is incorporated herein by reference.

Multi-layers of indium selenide ($In_2Se_3$) 510 may be used as glue by selenidation reaction above 200° C. Selenidation reaction is a processing step whereby a stack of homogenous, alternating films of In and Se are heated and annealed together to form a binary compound $In_2Se_3$. If the annealing process is done with the stack of $In_2Se_3$ layers 510 also in contact with the protective layer 350 on the rotor wafer 220, the binary compound may adhere to the rotor wafer 220, as well. Therefore, the annealed $In_2Se_3$ layers may act as a bond layer 520 holding the handle wafer 530 to the rotor wafer 220. The $In_2Se_3$ multi-stacked layers 510 (before annealing), 520 (after annealing) are shown in FIG. 3(a). After annealing, the handle wafer 530 is bonded with the rotor wafer 220. Next, wafer thinning process may be performed, where the rotor wafer 220 is thinned at the stator side from approximately 600 microns to about 100 microns in thickness. Because the wafer thinning is performed at an early stage, the conductive electrodes formed subsequently may be protected from the grinding process.

Figure 4:
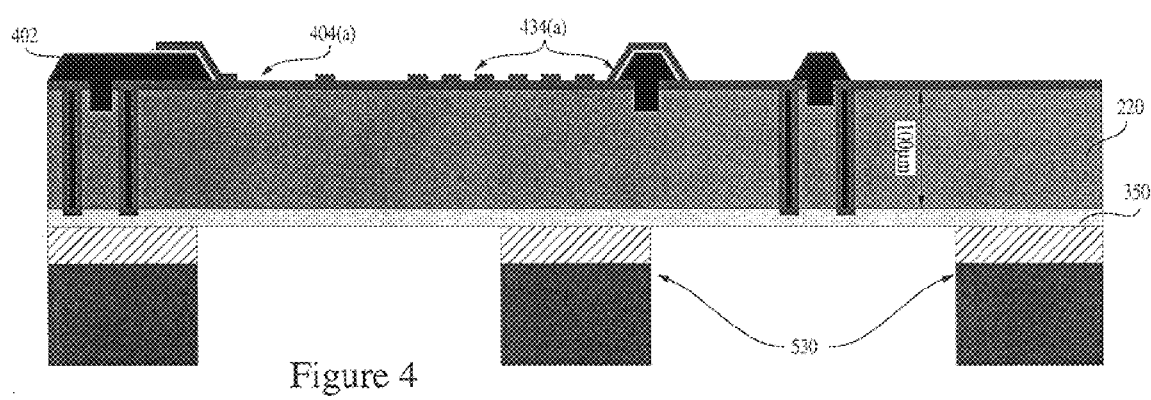
FIGS. 4–10 illustrate an exemplary process flow for the exemplary ARS system.

In FIG. 4, the thinned rotor wafer 220, which has been bonded with the handle wafer 530 for easy handling, may be turned over for the stator side of the rotor wafer 220 to be processed by depositing conductive electrodes 434(a), such as Ti/TiN electrodes, on the stator side of the rotor wafer 220. Poly Si 402 and an insulating layer 404(a), such as an insulating $SiO_2$ layer, may also be deposited on the stator side of the rotor wafer 220. The Poly Si 402 may be used as a conductor for the through-wafer vias 226.

Figure 5:
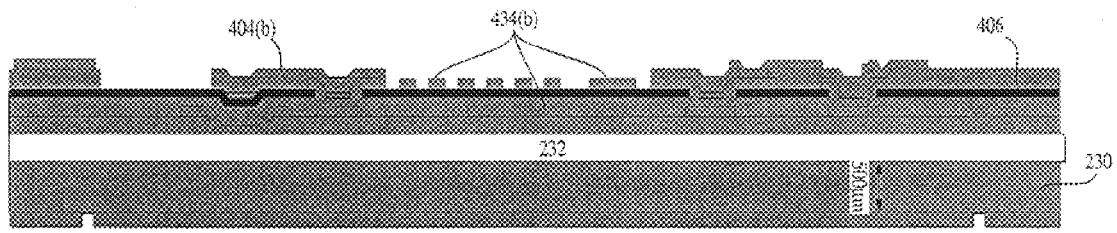

Referring to FIG. 5, CMOS circuitry 232 may be formed in the stator wafer 230, followed by processing the rotor side of the stator wafer 230 by depositing conductive electrodes 434(b), such as Ti/TiN electrodes on the rotor side of the stator wafer 230. An insulating layer 404(b), such as an insulating $SiO_2$ layer, and an alternative insulating layer 206, such as an insulating $Si_3N_4$ layer may also be deposited on the rotor side of the stator wafer 230. Since the heat sensitive CMOS circuitry 232 is formed at a relative later stage, any previous device processing may be performed regardless of thermal budget. In addition, with reduced subsequent device processing, the CMOS circuitry 232 may be less likely to be damaged, and device yield may be enhanced.

Figure 6:
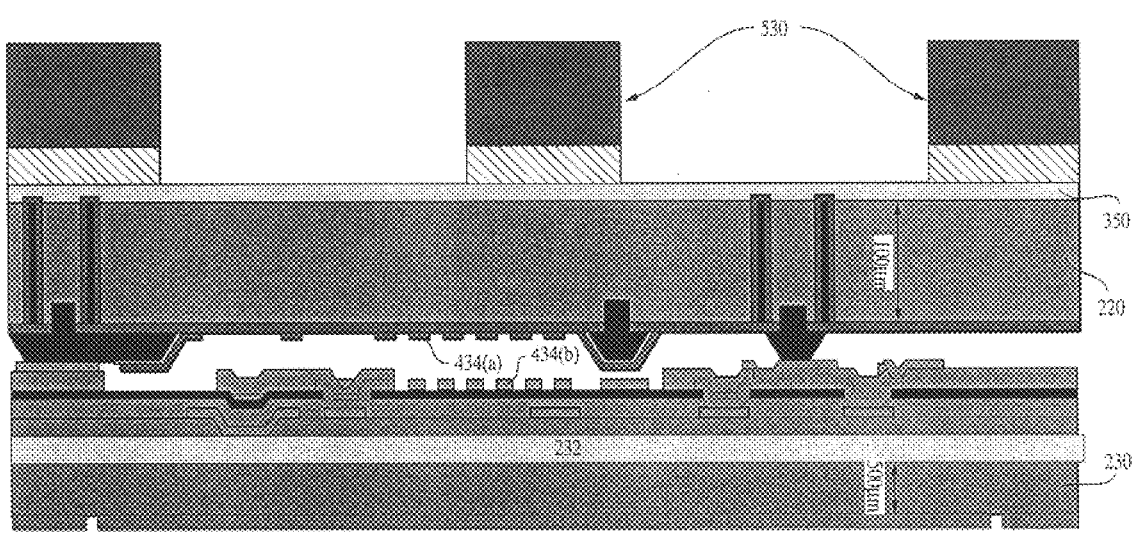
Figure 7:
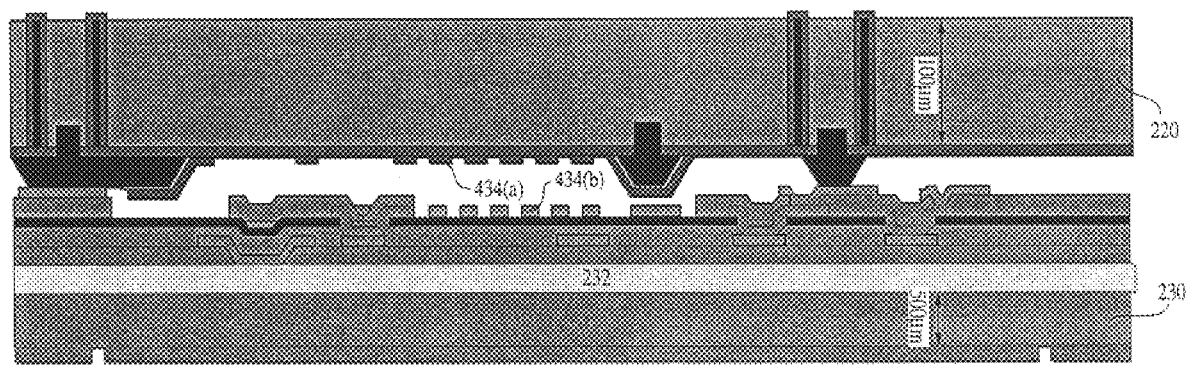

Next, as shown in FIG. 6, the rotor wafer 220 and the stator wafer 230 may be bonded using wafer bonding techniques. The conductive electrodes 434(a), 434(b) may conduct with one another for the read/write operations. After the bonding of the rotor wafer 220 and the stator wafer 230, the handle wafer 530 maybe detached, as shown in FIG. 7, by selective wet etching the $In_2Se_2$ bond layer 520. After the handle wafer 530 has been removed, the protective layer 350 may be removed from the rotor wafer 220 by isotropic wet etching or vapor etching.

Figure 8:
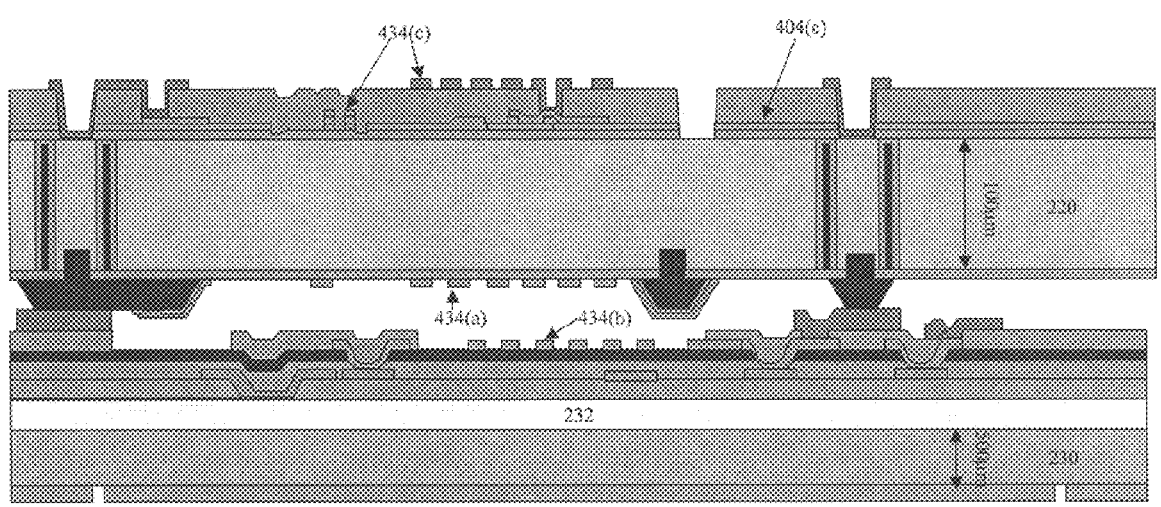

Referring to FIG. 8, the media side of the rotor wafer 230 may be processed next by depositing conductive electrodes 434(c), such as conductive Ti/TiN electrodes, on the media side of the rotor wafer 220 to form a surface 460 for the ARS storage media 222. An insulating layer 404(c), such as an insulating $SiO2$ layer, may be coated beneath or over the conductive electrodes 434(c) on the media side of the rotor wafer 220 for electrical insulation and surface protection. Because the processing of the media side of the rotor wafer 230 is performed near the end of the ARS process flow, the media surface 222 may be preserved from wafer grinding process, and the conductive electrodes 434(c) may be protected accordingly.

Figure 9:
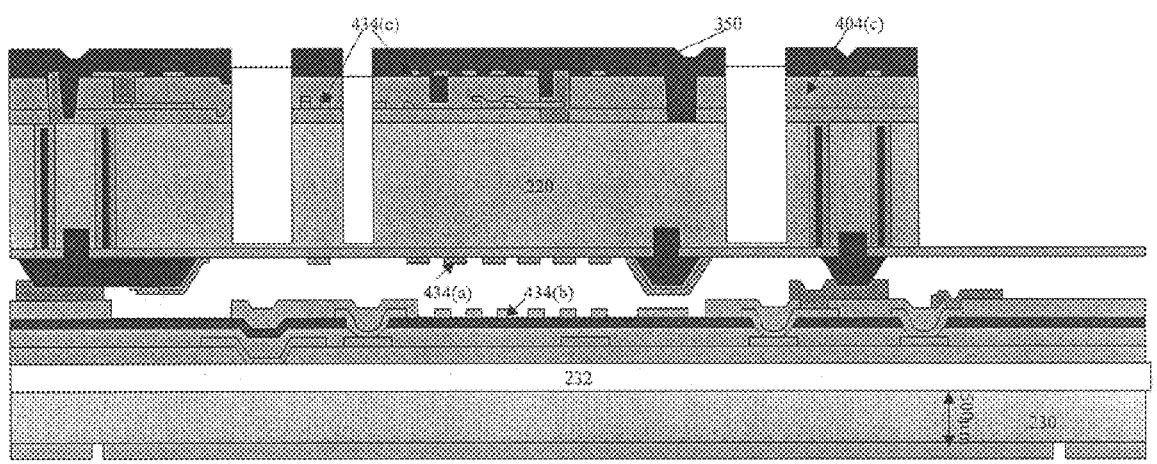
Figure 10:
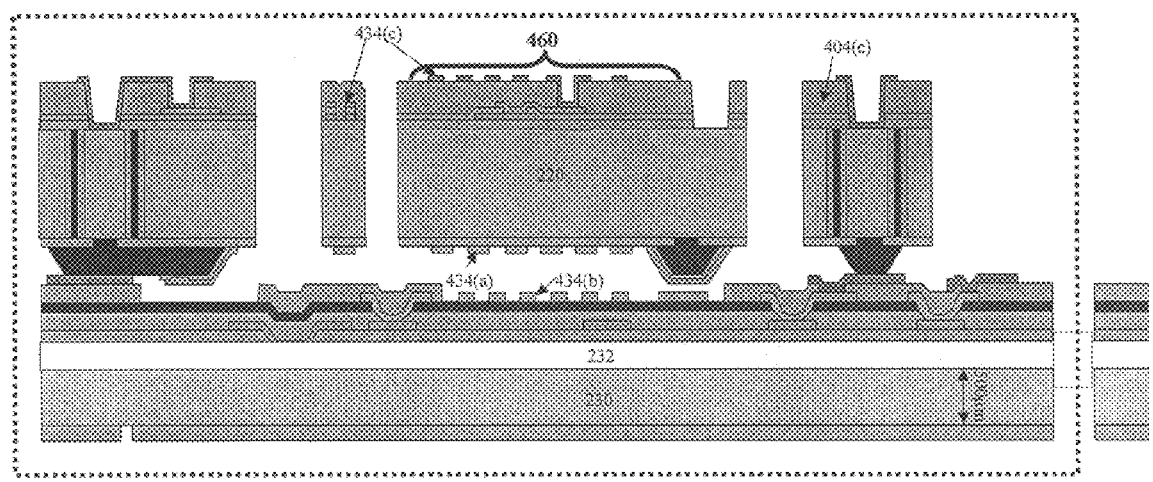

Referring to FIG. 9, suspension springs 240 may be formed by selectively deep Si etching the rotor wafer 220. The suspension springs 240, typically formed for micro electro mechanical systems (MEMS) devices, may be used to hold the rotor wafer 220 between the field emitter tips 214 and the stator wafer 230 to allow the data bits to be moved relative to the field emitter tips 214, thus allowing each field emitter tip 214 to access multiple data bits. MEMS refers to using integrated circuit technology to make moving parts in addition to electrical circuits on Si chips. First, a predetermined portion of the protective layer 350 may be etched, so that the portion of the rotor wafer 220 corresponding to the etched portion of the protective layer 350 is exposed. Next, the exposed portion of the rotor wafer 220 may be removed by deep Si etching using the protective layer 350 as a mask. The protective layer 350 as a mask may be, for example, a hard masking oxide layer or a soft masking PR layer. Finally, laser dicing may be performed to cut the rotor wafer 220 into individual rectangular devices, i.e., dices, with a computer guided laser.

The process flow described above deposits the conductive electrodes 434(c) on the media side of the rotor wafer 220 after the wafer thinning process, i.e., grinding and CMP, thus protecting the conductive electrodes 434(c) on the media surface 460 from the grinding process. In addition, the CMOS circuitry 232 is formed in the stator wafer 230 at a relatively later stage. Therefore, the CMOS circuitry 232 is less likely to be damaged by heat processing. In addition, some of the necessary processing may be performed with loosened thermal budget. Finally, because the wafer bonding of the rotor wafer 220 and the stator wafer 230 is performed at a later stage, there is less probability of degradation of the wafer bonding. Accordingly, device yield may be improved, leading to lower manufacturing cost.

Figure 11:
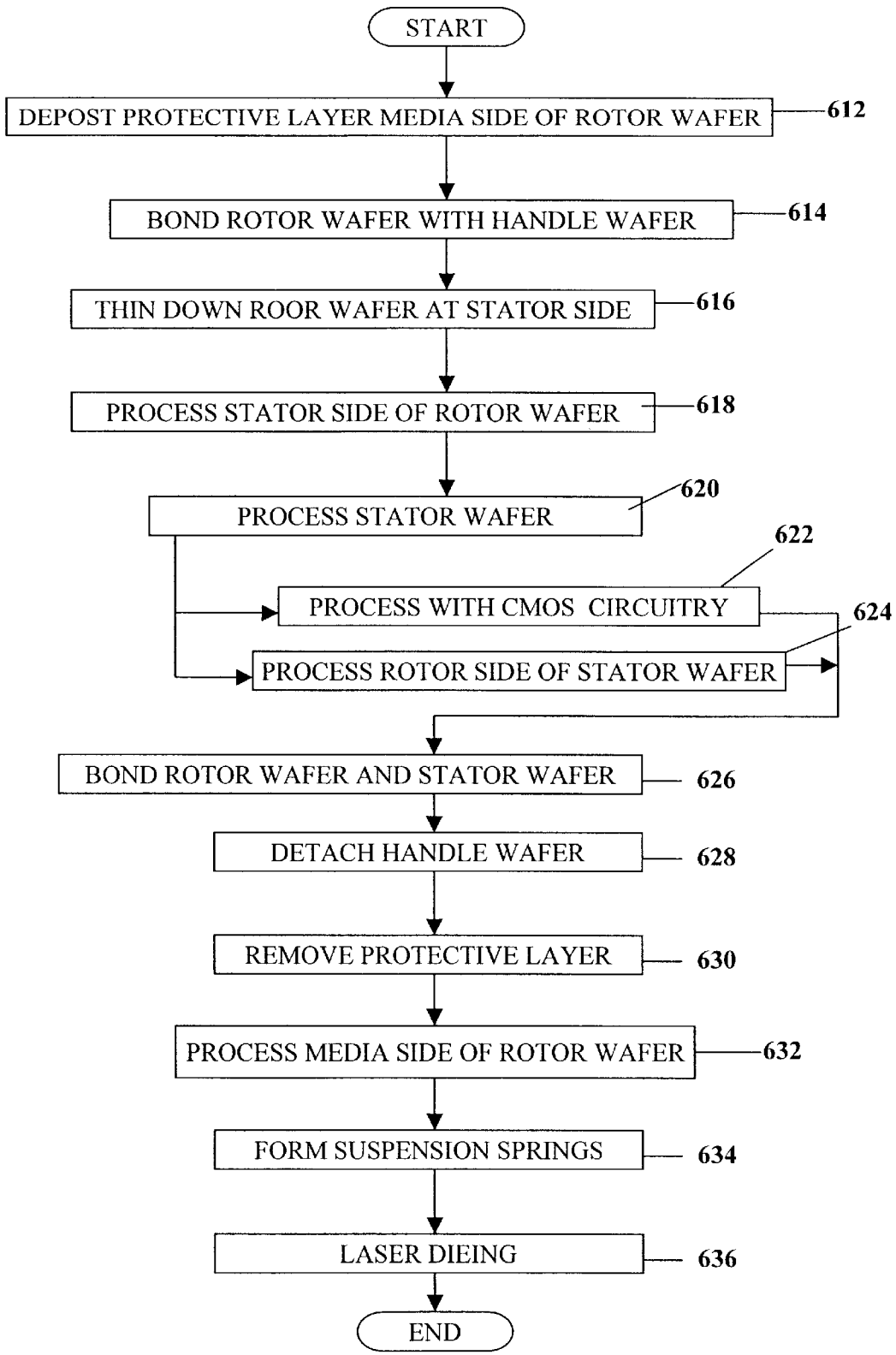
FIG. 11 is a flow chart illustrating the exemplary process flow for the exemplary ARS system.

FIG. 11 is a flow chart illustrating the steps of the improved process flow for the ARS system 200. The first step involves coating a protective layer 350 on a media side of the rotor wafer 220 (step 612). The media side of the rotor wafer 220 may then be bonded with a handle wafer 530 for easy handling using, for example, selenidation reaction (step 614). Multi-layers of $In_2Se_3$ 510 may be annealed and may act as a bond layer 520 holding the handle wafer 530 to the rotor wafer 220. Next, the rotor wafer 220 may be thinned down at a stator side to approximately 100 microns in thickness (step 616).

The next step involves processing the stator side of the rotor wafer 220 by deposing Poly Si 402, conductive electrodes 434(a), and an insulating layer 404(a) on the stator side of the rotor wafer 220 (step 618). A stator wafer 230 may then be processed (step 620). The processing of the stator wafer 230 may involve forming CMOS circuitry 232 in the stator wafer 230 (step 622), as well as processing a rotor side of the stator wafer 230 by depositing conductive electrodes 434(b) on the rotor side of the stator wafer 230 (step 624). An insulating layer 404(b) and an alternative insulating layer 206 may also be deposited on the rotor side of the stator wafer 230.

Subsequently, the rotor wafer 220 may be turned over, with the assistance of the handle wafer 530, and may bond with the stator wafer 230 at the stator side (step 626). After the bonding of the rotor wafer 220 and the stator wafer 230, the handle wafer 530 may be detached by selectively wet etching of the bond layer 520 (step 628). Similarly, the protective layer 350 may be removed by isotropic wet etching or vapor etching (step 630).

The next step involves processing the media side of a rotor wafer 120 by depositing conductive electrodes 134(*c*) on the media side of the rotor wafer 120 (step 632). Finally, suspension springs 140 may be formed by first patterning the protective layer 350 and then deep Si etching the exposed portion of the rotor wafer 220 (step 634). The improved process flow may conclude with laser dicing, which cut the rotor wafer 220 into individual rectangular devices with a computer guided laser (step 636).

while the process flow has been described in connection with an exemplary embodiment, it will be understood that many modifications in light of these teachings will be readily apparent to those skilled in the art, and this application is intended to cover any variations thereof.

What is claimed is:

1. A method for processing an atomic resolution storage (ARS) system, comprising:
    depositing a protective layer on a first side of a first wafer;
    bonding the first wafer with a handle wafer;
    thinning the first wafer at a second side of the first wafer;
    processing a second wafer;
    bonding the first wafer and the second wafer;
    detaching the handle wafer; and
    processing the first side of the first wafer by depositing conductive electrodes on the first side of the first wafer.
2. The method of claim 1, further comprising forming suspension springs.
3. The method of claim 2, wherein the forming the suspension springs step comprises:
    patterning the protective layer;
    selectively etching the protective layer; and
    selectively deep Si etching the first wafer using the protective layer as a mask.
4. The method of claim 1, further comprising removing the protective layer.
5. The method of claim 1, further comprising laser dicing.
6. The method of claim 1, wherein the depositing the protective layer step includes depositing an oxide layer or a photoresist (PR) layer.
7. The method of claim 1, wherein the depositing the protective layer step includes depositing a borophosphosilicate glass (BPSG) layer.
8. The method of claim 1, wherein the bonding the first wafer with the handle wafer step includes bonding the first wafer with a mesh-shaped handle wafer.
9. The method of claim 1, wherein the bonding the first wafer with the handle wafer step includes using selenidation reaction.
10. The method of claim 9, wherein the detaching step includes detaching the handle wafer by selectively wet etching of a bond layer.
11. The method of claim 1, further comprising processing a second side of the first wafer by depositing conductive electrodes on the second side of the first wafer.
12. The method of claim 1, wherein the processing the second wafer step includes forming complementary metal oxide semiconductor (CMOS) CMOS circuitry in the second wafer.
13. The method of claim 1, wherein the processing the second wafer step includes processing a surface of the second wafer by depositing conductive electrodes on the surface of the second wafer.
14. A method for processing for an atomic resolution storage (ARS) system, comprising:
    depositing a protective layer on a media side of the rotor wafer;
    bonding the rotor wafer with a handle wafer;
    thinning the rotor wafer at a stator side of the rotor wafer;
    processing the stator side of the rotor wafer;
    processing a stator wafer;
    bonding the rotor wafer and the stator wafer;
    detaching the handle wafer;
    removing the protective layer;
    processing the media side of a rotor wafer by depositing conductive electrodes on the media side of the rotor wafer;
    forming suspension springs; and
    laser dicing.

* * * * *